(12) United States Patent
Kosuga et al.

(10) Patent No.: US 10,506,744 B2
(45) Date of Patent: Dec. 10, 2019

(54) POWER CONVERSION DEVICE

(71) Applicant: Hitachi Automotive Systems, Ltd., Hitachinaka-shi, Ibaraki (JP)

(72) Inventors: Masashi Kosuga, Hitachinaka (JP); Takeshi Tajiri, Hitachinaka (JP); Hidehiko Takahara, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 16/313,940

(22) PCT Filed: Jun. 19, 2017

(86) PCT No.: PCT/JP2017/022451
§ 371 (c)(1),
(2) Date: Dec. 28, 2018

(87) PCT Pub. No.: WO2018/008371
PCT Pub. Date: Jan. 11, 2018

(65) Prior Publication Data
US 2019/0230813 A1 Jul. 25, 2019

(30) Foreign Application Priority Data

Jul. 8, 2016 (JP) ................................. 2016-135759

(51) Int. Cl.
*H05K 7/20* (2006.01)
*H02M 5/257* (2006.01)
*H02M 7/48* (2007.01)

(52) U.S. Cl.
CPC .......... *H05K 7/2089* (2013.01); *H02M 5/257* (2013.01); *H02M 7/48* (2013.01)

(58) Field of Classification Search
USPC .................................................. 361/688, 131
See application file for complete search history.

(56) References Cited

U.S. PATENT DOCUMENTS 6,870,253 B1 * 3/2005 Ushijima .............. H01L 25/115
257/691
7,978,471 B2 * 7/2011 Tokuyama .............. H01L 23/36
361/699

(Continued)

FOREIGN PATENT DOCUMENTS

JP 2002-320392 A 10/2002
JP 2014-166080 A 9/2014

(Continued)

OTHER PUBLICATIONS

International Search Report (PCT/ISA/210) issued in PCT Application No. PCT/JP2017/022451 dated Sep. 5, 2017 with English translation (three (3) pages).

(Continued)

*Primary Examiner* — William H. Mayo, III
*Assistant Examiner* — Krystal Robinson
(74) *Attorney, Agent, or Firm* — Crowell & Moring LLP

(57) ABSTRACT

Insulating properties between a metallic member supporting a power semiconductor module and an input/output terminal of the power semiconductor module are secured. In a power conversion device in which a bus bar of a connecting member is connected to an input/output terminal and the like of a semiconductor module protruding through an opening of a metallic member, the connecting member includes extended portions which extend in a space between the bus bar and the opening of the metallic member.

7 Claims, 11 Drawing Sheets

(56) References Cited

U.S. PATENT DOCUMENTS

| | | | | |
|---|---|---|---|---|
| 8,422,235 B2* | 4/2013 | Azuma | ............... | B60K 6/445 |
| | | | | 361/688 |
| 8,531,840 B2* | 9/2013 | Tachibana | ............ | H05K 7/1432 |
| | | | | 361/688 |
| 9,247,675 B2* | 1/2016 | Higuchi | ................ | B60L 15/20 |
| 9,362,261 B2* | 6/2016 | Tokuyama | ............ | H01L 25/18 |
| 10,080,313 B2* | 9/2018 | Shintani | ................ | H01L 23/043 |
| 2001/0036082 A1* | 11/2001 | Kanesaka | ............... | B60Q 7/00 |
| | | | | 362/555 |
| 2002/0114127 A1* | 8/2002 | Guggisberg | ........... | H01G 4/228 |
| | | | | 361/309 |
| 2007/0252169 A1* | 11/2007 | Tokuyama | ............ | H02M 7/003 |
| | | | | 257/162 |
| 2008/0130223 A1* | 6/2008 | Nakamura | ............ | H02M 7/003 |
| | | | | 361/689 |
| 2008/0186751 A1* | 8/2008 | Tokuyama | ............ | H01L 23/473 |
| | | | | 363/131 |
| 2009/0294195 A1* | 12/2009 | Otsuka | ................... | B60K 6/405 |
| | | | | 180/65.275 |
| 2012/0300522 A1* | 11/2012 | Tokuyama | ............ | H01L 25/072 |
| | | | | 363/131 |
| 2015/0163962 A1* | 6/2015 | Suzuki | ................... | H02M 7/003 |
| | | | | 361/699 |
| 2015/0382501 A1* | 12/2015 | Horiuchi | ............ | H05K 7/20927 |
| | | | | 363/131 |
| 2016/0037654 A1* | 2/2016 | Kosuga | ................ | H02M 7/003 |
| | | | | 361/807 |
| 2017/0313159 A1* | 11/2017 | Takagi | ............... | B60H 1/00914 |
| 2019/0123657 A1* | 4/2019 | Miura | ................... | H02M 7/003 |
| 2019/0157185 A1* | 5/2019 | Tsuyuno | ................ | H01L 21/52 |
| 2019/0157194 A1* | 5/2019 | Iyama | ..................... | H01L 23/48 |

FOREIGN PATENT DOCUMENTS

| | | |
|---|---|---|
| JP | 2015-61454 A | 3/2015 |
| JP | 2016-36194 A | 3/2016 |

OTHER PUBLICATIONS

Japanese-language Written Opinion (PCT/ISA/237) issued in PCT Application No. PCT/JP2017/022451 dated Sep. 5, 2017 (three (3) pages).

* cited by examiner

POWER CONVERSION DEVICE

TECHNICAL FIELD

The present invention relates to a power conversion device.

BACKGROUND ART

A power conversion device for driving a vehicle, such as a hybrid vehicle and an electric vehicle, has, for example, three-phase power semiconductor modules incorporating upper and lower arm series circuits of an inverter circuit. For example, the power semiconductor module has an input/output terminal connected to a bus bar of a molded bus bar in which the bus bar is integrated with a resin portion and a signal terminal connected to a control circuit board. In recent years, studies have been conducted regarding a structure to achieve further reduction in size of the power conversion device and hold the power semiconductor module using a metallic member having heat dissipation properties. In such a structure, the input/output terminal of the power semiconductor module is inserted through an opening provided in the metallic member and protrudes outward.

As a structure for connecting the signal terminal of the power semiconductor module to the control circuit board, the following structure is known. A power semiconductor module is clamped by a module pressing member into which a plurality of signal relay terminals is inserted and a heat sink. A control circuit board is arranged above the module pressing member. One end of the signal relay terminal of the module pressing member is connected to a signal terminal of the power semiconductor module, and the other end of the signal relay terminal is connected to the control circuit board (for example, see PTL 1).

CITATION LIST

Patent Literature

PTL 1: JP 2002-320392 A

SUMMARY OF INVENTION

Technical Problem

Since the power semiconductor module is clamped between the module pressing member and the heat sink in the structure described in PTL 1, the module pressing member and the heat sink are required to have large rigidity. Thus, it is difficult to achieve reduction in size. It is also conceivable to provide a structure in which the power semiconductor module is supported by the metallic member in Cited Literature 1. However, a high voltage is applied to an input/output terminal for power supply although a low voltage is applied between the signal terminals of the power semiconductor module. If the size of the power conversion device is reduced and a space between an edge of an opening of the metallic member and the input/output terminal becomes small, it is difficult to secure insulating properties and there is a possibility of short circuit.

Solution to Problem

According to one aspect of the present invention, a power conversion device includes: a semiconductor module having an input or output terminal; a connecting member in which a resin portion is integrally provided with a connection conductor connected to the terminal; and a metallic member having an opening through which the terminal protrudes and supporting the semiconductor module. The connecting member has an insulating extended portion extending in a space between the terminal and the opening of the metallic member.

Advantageous Effects of Invention

According to the present invention, it is possible to secure the insulating properties between the terminal of the semiconductor module and the metallic member.

DESCRIPTION OF EMBODIMENTS

Figure 1:
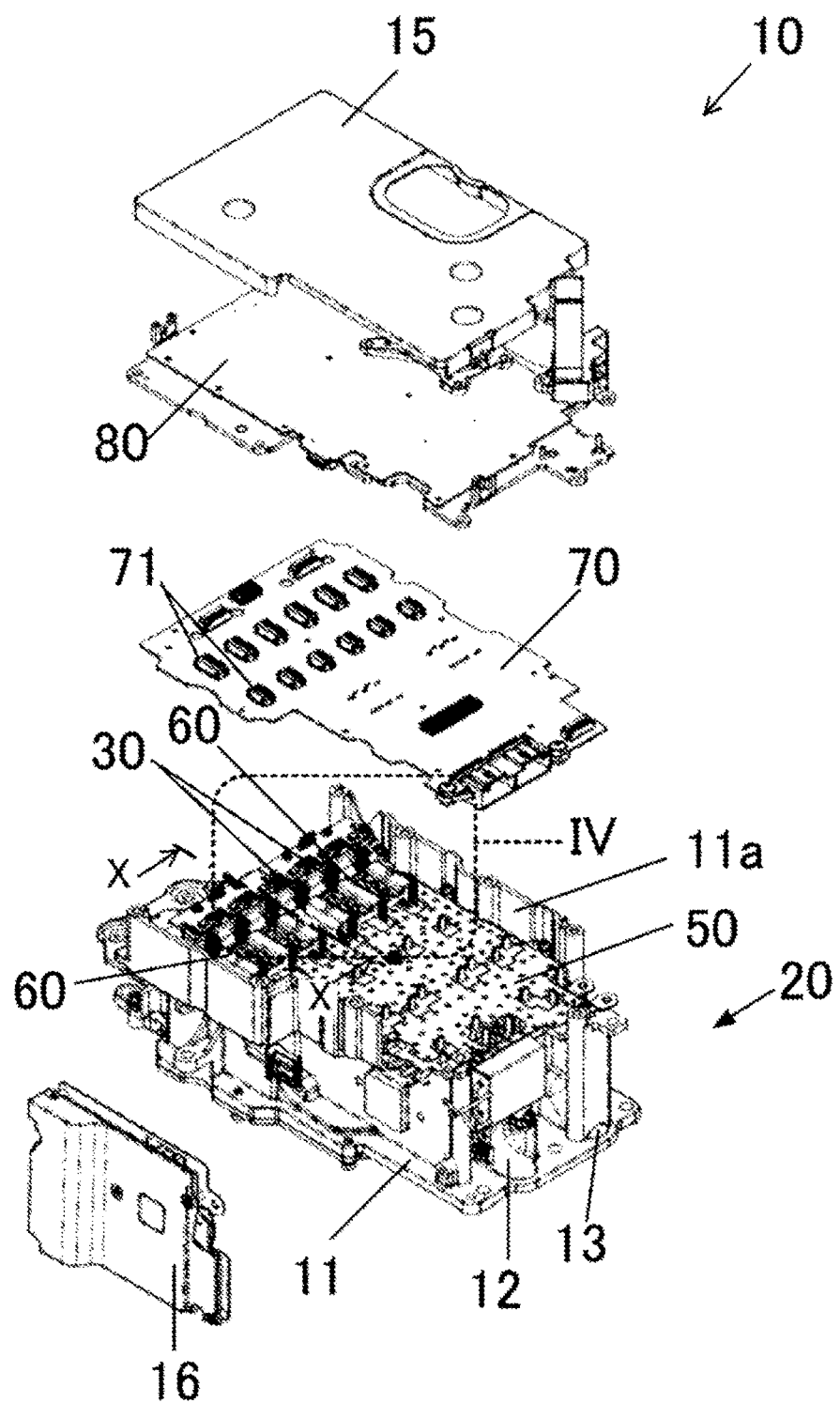
FIG. 1 is an exploded perspective view illustrating one embodiment of a power conversion device of the present invention.
Figure 2:
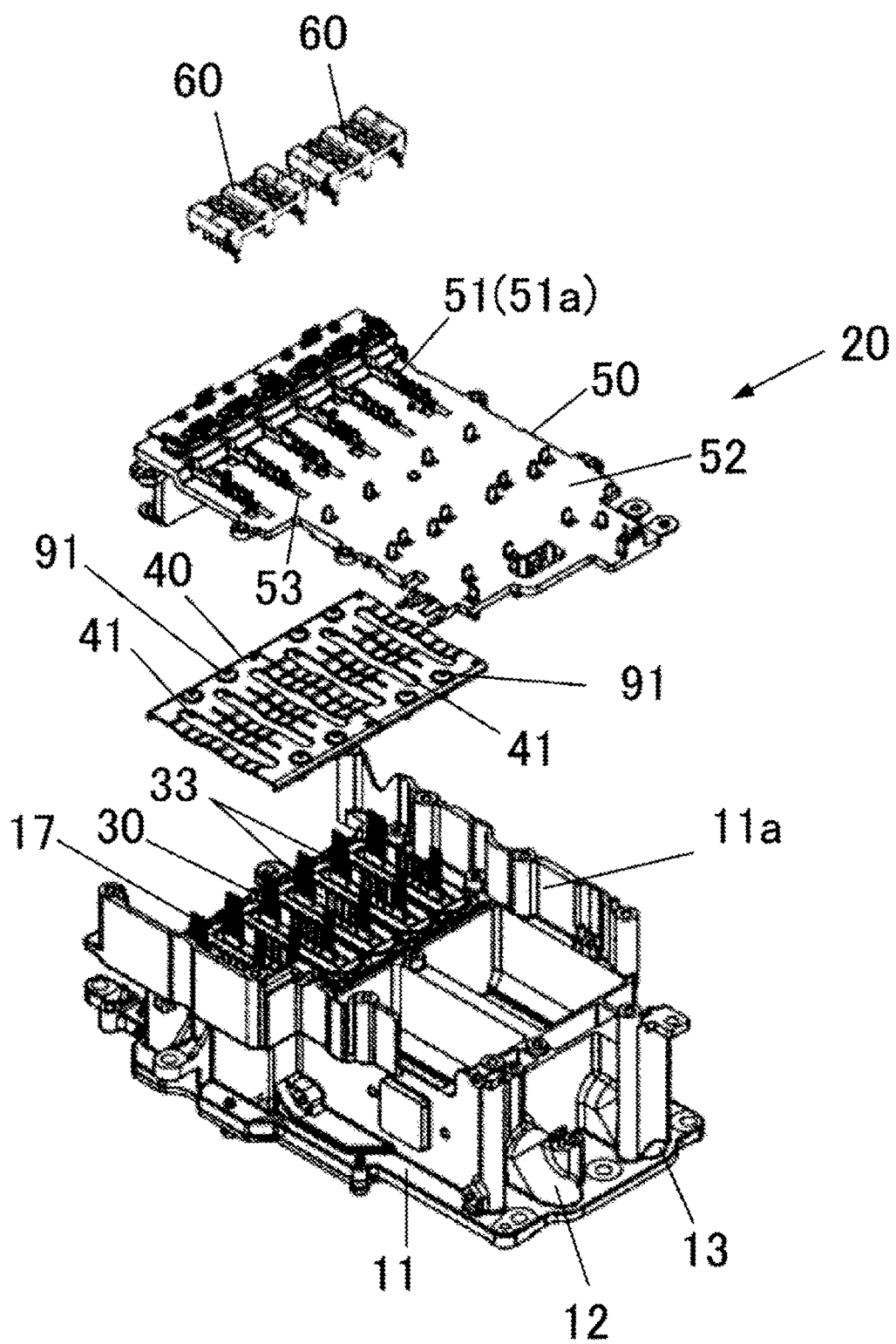
FIG. 2 is an exploded perspective view of an intermediate assembly of the power conversion device illustrated in FIG. 1.

Hereinafter, an embodiment of a power conversion device of the present invention will be described with reference to the drawings. FIG. 1 is an exploded perspective view illustrating one embodiment of the power conversion device of the present invention, and FIG. 2 is an exploded perspective view of an intermediate assembly of the power conversion device illustrated in FIG. 1. A power conversion device 10 includes a housing configured by a housing main body 11 and an upper cover 15. For example, the housing main body 11 is a box-shaped member formed by casting metal such as an aluminum alloy and having an opening portion 11a formed at the top. The upper cover 15 seals the opening portion 11a of the housing main body 11. A side cover 16 is attached to a side portion of the housing main body 11. The housing main body 11 is a cooling flow path forming body, and a refrigerant inlet 12 for introducing a refrigerant such as cooling water and a refrigerant outlet 13 are formed at the bottom. The refrigerant inlet 12 and the refrigerant outlet 13 have opening portions on a lower surface of the bottom.

Six power semiconductor modules (hereinafter also referred to simply as "semiconductor modules") 30, a metallic member 40, a molded bus bar 50, an insulating member 60, a control circuit board 70, and a holding member 80 are accommodated in the housing main body 11 and the upper cover 15. Incidentally, an intermediate assembly 20 illustrated in FIG. 1 is configured such that the six power semiconductor modules 30, the metallic member 40, the molded bus bar 50, and the insulating member 60 are accommodated in the housing main body 11 as illustrated in FIG. 2.

The housing main body 11, which is the cooling flow path forming body, has an accommodating portion 17 accommodating each of the power semiconductor modules 30. Although not illustrated, a cooling flow path that connects the accommodating portions 17 in which the power semiconductor modules 30 are accommodated, respectively, in a zigzag manner is formed inside the housing main body 11. The refrigerant such as cooling water is introduced into the housing main body 11 from the refrigerant inlet 12, cools each of the power semiconductor modules 30, and is led out from the refrigerant outlet 13.

The metallic member 40 is made of metal having spring properties such as iron, and SUS. The metallic member 40 is arranged above the power semiconductor module 30 and is fixed to the housing main body 11 by a fastening member 91 such as a screw. A peripheral edge portion of the metallic member 40 and a peripheral edge portion of the housing main body 11 are formed to have a watertight structure using a seal member. An opening 41 is formed in the metallic member 40 so as to correspond to each of the accommodating portions 17 of the housing main body 11. A terminal portion 33 of each of the power semiconductor modules 30 protrudes outward through the opening 41 of the metallic member 40 (see also FIGS. 10 and 11).

The molded bus bar 50 is a member in which a bus bar 51 which is a connection conductor is formed integrally with an insulating resin portion 52 by insert molding. The bus bar 51 has a connection terminal 51a connected to a part of the terminal portion 33 of each of the semiconductor modules 30. The molded bus bar 50 is fixed to the housing main body 11 by a fastening member (not illustrated) such as a screw.

The insulating member 60 insulates the terminal portion 33 of each of the semiconductor modules 30 from the metallic member 40. The insulating member 60 is fixed to the molded bus bar 50 in the state of being inserted into each of the openings 41 of the metallic member 40. A structure and an insulating operation of the insulating member 60 will be described later.

The control circuit board 70 is arranged above the molded bus bar 50 and the insulating member 60. The control circuit board 70 has a connector 71 connected to another part of the terminal portion 33 of each of the semiconductor modules 30. The control circuit board 70 has a control circuit section that controls a switching circuit section incorporated in each of the semiconductor modules 30.

Figure 3A:
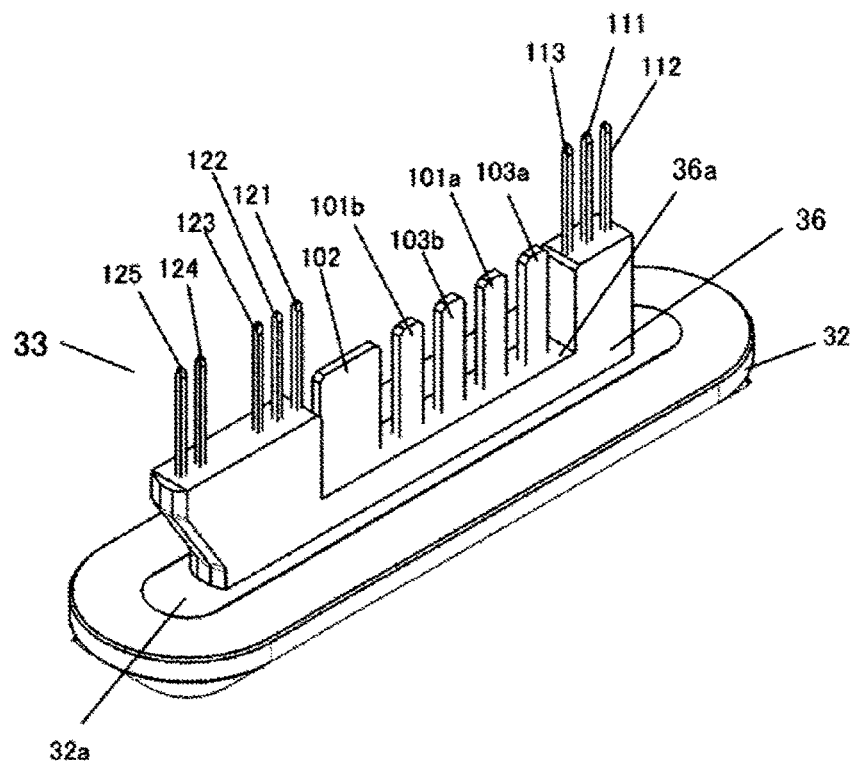
FIG. 3A is an enlarged view of the periphery of a terminal portion of a power semiconductor module illustrated in FIG. 1.
Figure 3B:
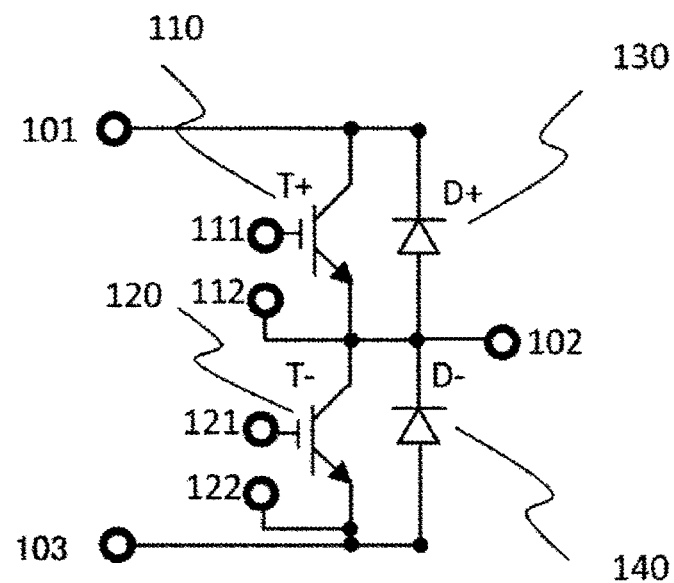
FIG. 3B is a circuit diagram illustrating an example of a circuit incorporated in the power semiconductor module.

FIG. 3(A) is an enlarged view of the periphery of the terminal portion 33 of the power semiconductor module 30 illustrated in FIG. 1, and FIG. 3(B) is a circuit diagram illustrating an example of a circuit incorporated in the power semiconductor module 30. The semiconductor module 30 has a main body portion 31 (see FIG. 5 and the like) in which multiple heat dissipation fins 31a (see FIG. 5 and the like) are formed, a flange portion 32, and the terminal portion 33. For example, each of the six power semiconductor modules 30 incorporates upper and lower arm circuits for a U-phase, a V-phase, and a W-phase configured to drive a motor or a motor and a generator, and output three-phase AC power.

As illustrated in FIG. 3(B), the semiconductor module 30 incorporates two IGBTs 110 and 120 and two diodes 130 and 140. The IGBT 110 and the diode 130 form the upper arm circuit. The IGBT 120 and the diode 140 form the lower arm circuit. An emitter of IGBT 110 and a collector of IGBT 120 are connected to each other. This connection point is connected with a connection point between an anode of the diode 130 and a cathode of the diode 140, and is connected with an AC output terminal 102. A collector of the IGBT 110 and a cathode of the diode 130 are connected to a DC positive input terminal 101. An emitter of the IGBT 120 and an anode of the diode 140 are connected to a DC negative input terminal 103. Further, gates of the IGBTs 110 and 120 are connected to gate terminals 111 and 121 which are signal terminals, respectively, and the emitters of the IGBTs 110 and 120 are connected to emitter terminals 112 and 122 which are signal terminals, respectively. Incidentally, T in FIG. 3(B) indicates the IGBT, and D indicates the diode.

The input/output terminals 101 to 103 and the signal terminals 111, 112, 121, and 122 illustrated in FIG. 3(B) are led out to the outside from the opening of the flange portion 32 of the semiconductor module 30 as illustrated in FIG. 3(A). However, as illustrated in FIG. 3(A), the DC negative input terminal 103 is formed to be branched into two terminals as 103a and 103b, and is electrically connected inside the semiconductor module 30. Further, the DC positive input terminal 101 is formed to be branched into two as 101a and 101b, and is electrically connected inside the semiconductor module 30. The flange portion 32 is formed using an insulating member such as resin, and the inside thereof is filled a sealing resin 32a. Incidentally, in FIG. 3(A), the four signal terminals 113, 123 to 125 (not illustrated in FIG. 3(B)) are sensor signal terminals configured to detect overcurrent and excess temperature of the IGBTs 110 and 120.

Figure 4:
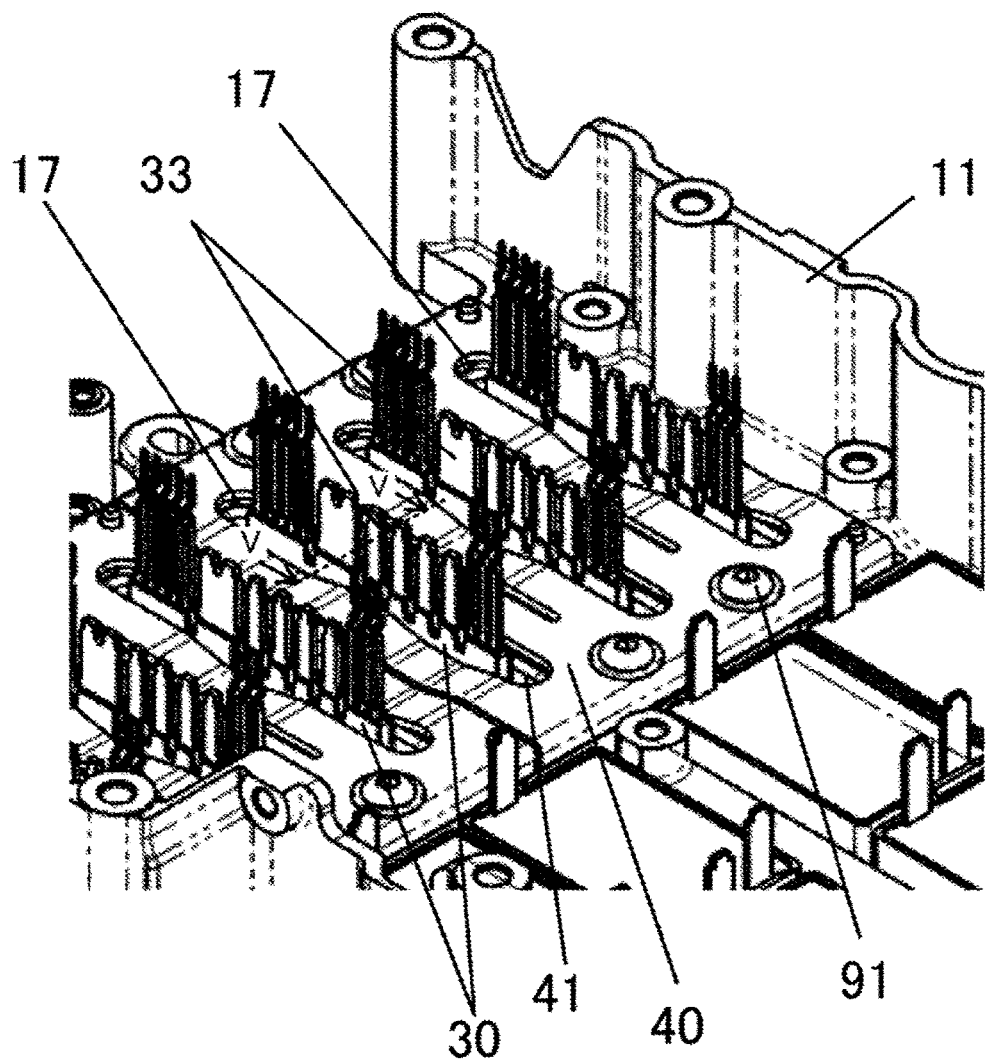
FIG. 4 is an enlarged view of a region IV of FIG. 1.
Figure 5:
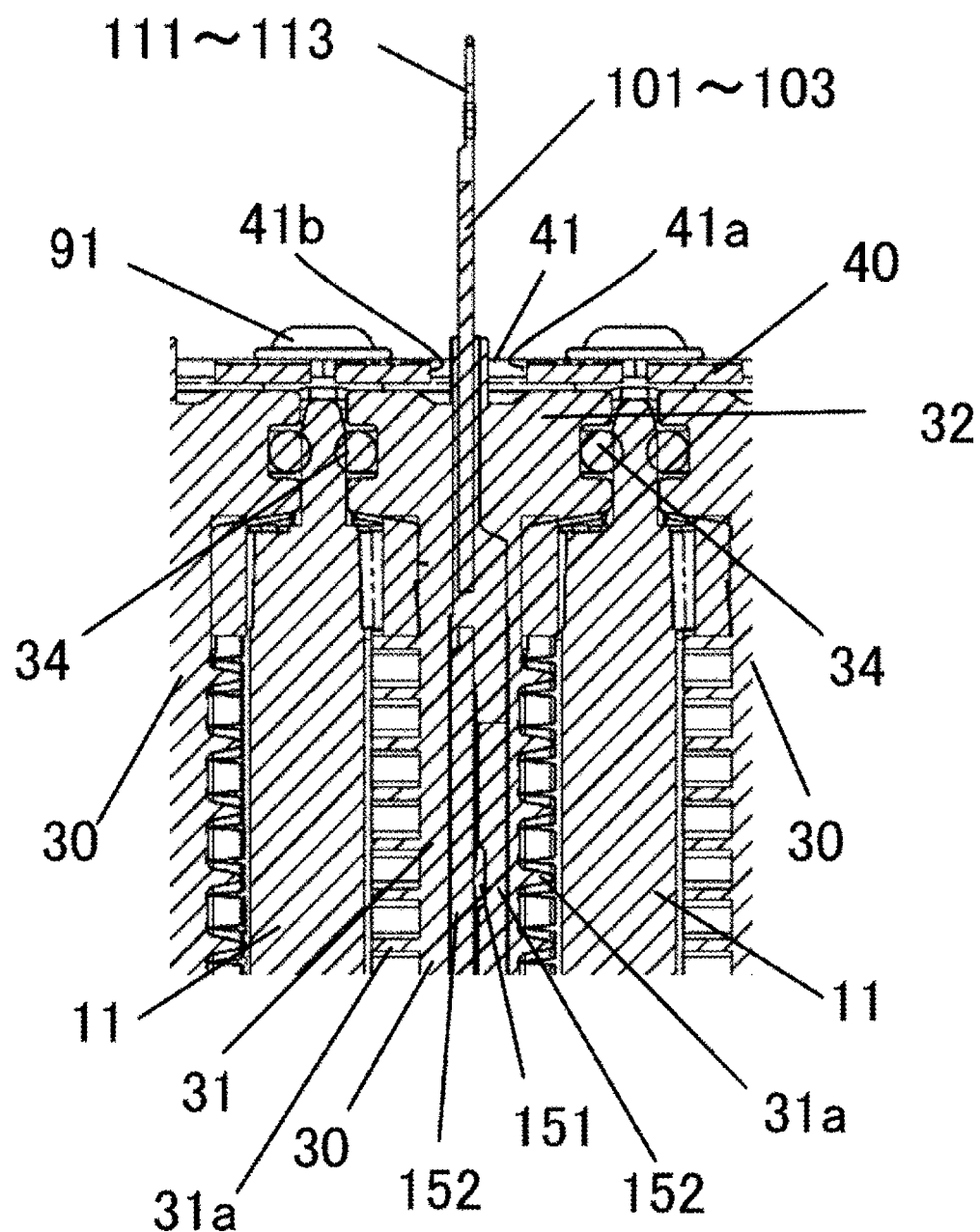
FIG. 5 is a cross-sectional view taken along a line V-V of FIG. 4.
Figure 6:
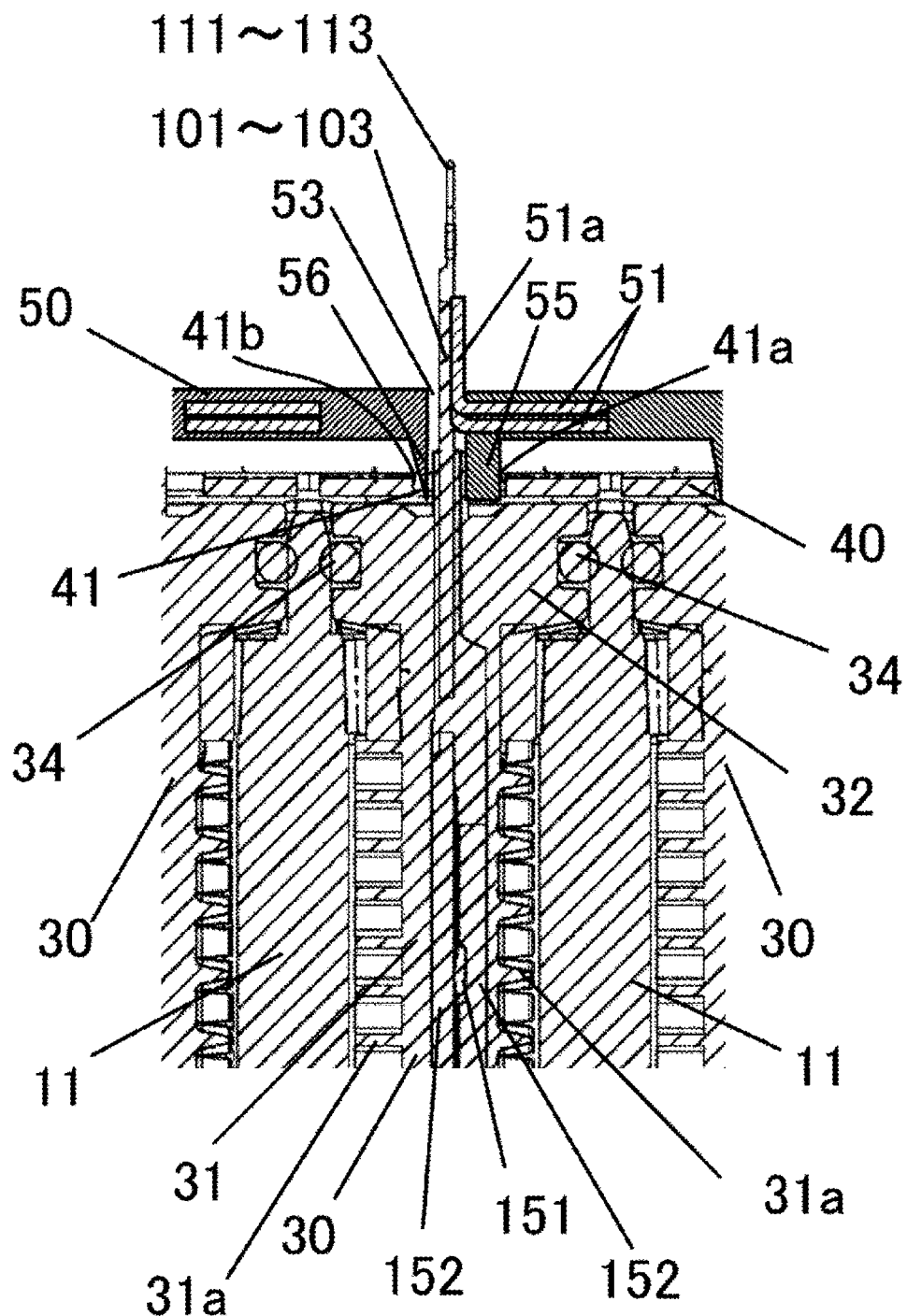
FIG. 6 is a cross-sectional view illustrating a state where a molded bus bar is assembled in the state illustrated in FIG. 5.

FIG. 4 is an enlarged view of a region IV of FIG. 1, FIG. 5 is a cross-sectional view taken along a line V-V of FIG. 4, and FIG. 6 is a cross-sectional view in a state where the molded bus bar is assembled in the state illustrated in FIG. 5. The main body portion 31 in which the multiple heat dissipation fins 31a are formed and the flange portion 32 of the semiconductor module 30, are accommodated inside the accommodating portion 17 of the housing main body 11. The metallic member 40 is arranged above the flange portion 32, and the metallic member 40 is fixed in close contact with an upper surface of the housing main body 11 by the fastening member 91 such as the screw (see also FIG. 11). Therefore, the flange portion 32 and the metallic member 40 are thermally coupled, and the heat generated from the semiconductor module 30 is thermally conducted to the metallic member 40 and is dissipated.

The flange portion 32 and the housing main body 11 of the semiconductor module 30 are formed to have a watertight structure using a sealing member 34 (see FIG. 5 and the like) such as an O-ring. Incidentally, the heat dissipation fins 31a of the semiconductor module 30 are exemplified as structures formed in different shapes and sizes on a front surface and a back surface in FIGS. 5 and 6. The DC positive and negative input terminals 101 and 103, the AC output terminal 102, the signal terminals 111 to 113 and 121 to 125 of each of the semiconductor modules 30 are inserted through the opening 41 of the metallic member 40 to protrude outward. Incidentally, the DC positive and negative input terminals 101 and 103 and the AC output terminal 102 will be represented by the input/output terminal 101 and the like, and the signal terminals 111 to 113 and 121 to 125 will be represented by the signal terminal 111 and the like in some cases in the following description.

As illustrated in FIGS. 5 and 6, the semiconductor module 30 includes: power semiconductor elements 151 such as the IGBTs 110 and 120 and the diodes 130 and 140; a lead frame 152; and the input/output terminal 101 and the like and the signal terminal 111 and the like connected to the lead frame 152. As illustrated in FIG. 6, the connection terminal 51a of the bus bar 51 of the molded bus bar 50 is bent upward, that is, toward a side opposite to a side of the semiconductor module 30. The molded bus bar 50 is provided with an opening portion 53 through which the input/output terminal 101 and the like and the signal terminal 111 and the like of the semiconductor module 30 are inserted. The connection terminal 51a of the bus bar 51 of the molded bus bar 50 is brought into close contact with the input/output terminal 101 and the like of the semiconductor module 30 inserted through the opening 41 of the metallic member 40 and the opening portion 53 of the molded bus bar 50, and is joined to the input/output terminal 101 and the like by welding or the like. Incidentally, the bus bar 51 includes a positive bus bar connected to the DC positive input terminal 101, a negative bus bar connected to the DC negative input terminal 103, and an AC bus bar connected to the AC output terminal 102.

A first extended portion 55 and a second extended portion 56 extending toward the semiconductor module 30 are formed on both side faces of the molded bus bar 50 facing the opening portion 53.

Figure 7:
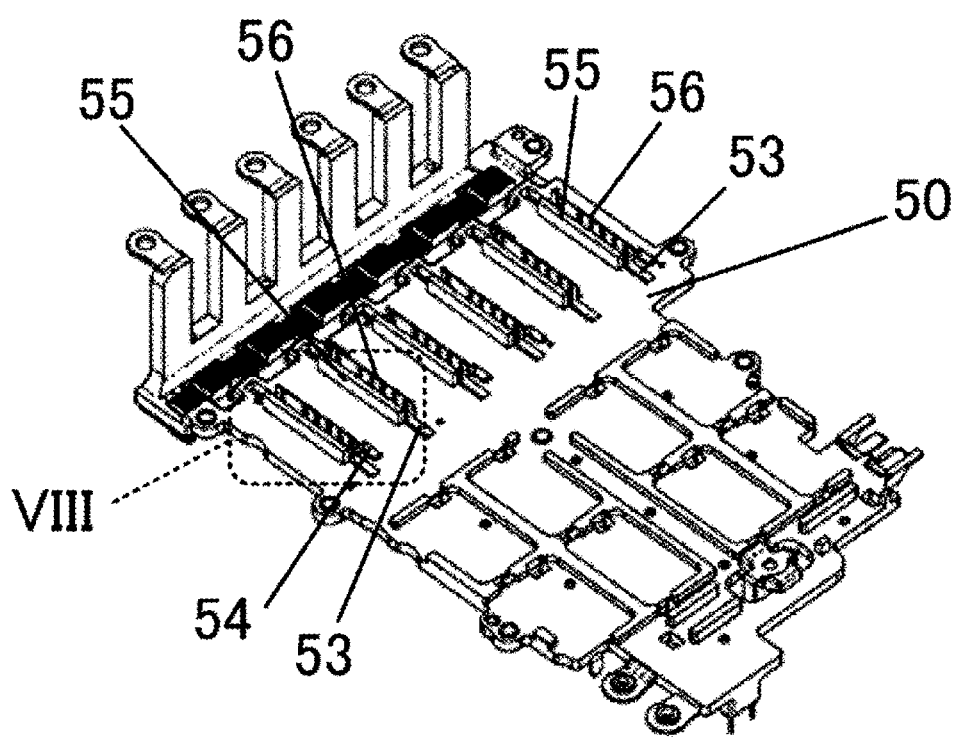
FIG. 7 is a perspective view of the molded bus bar illustrated in FIG. 2 as viewed from a back side.
Figure 8:
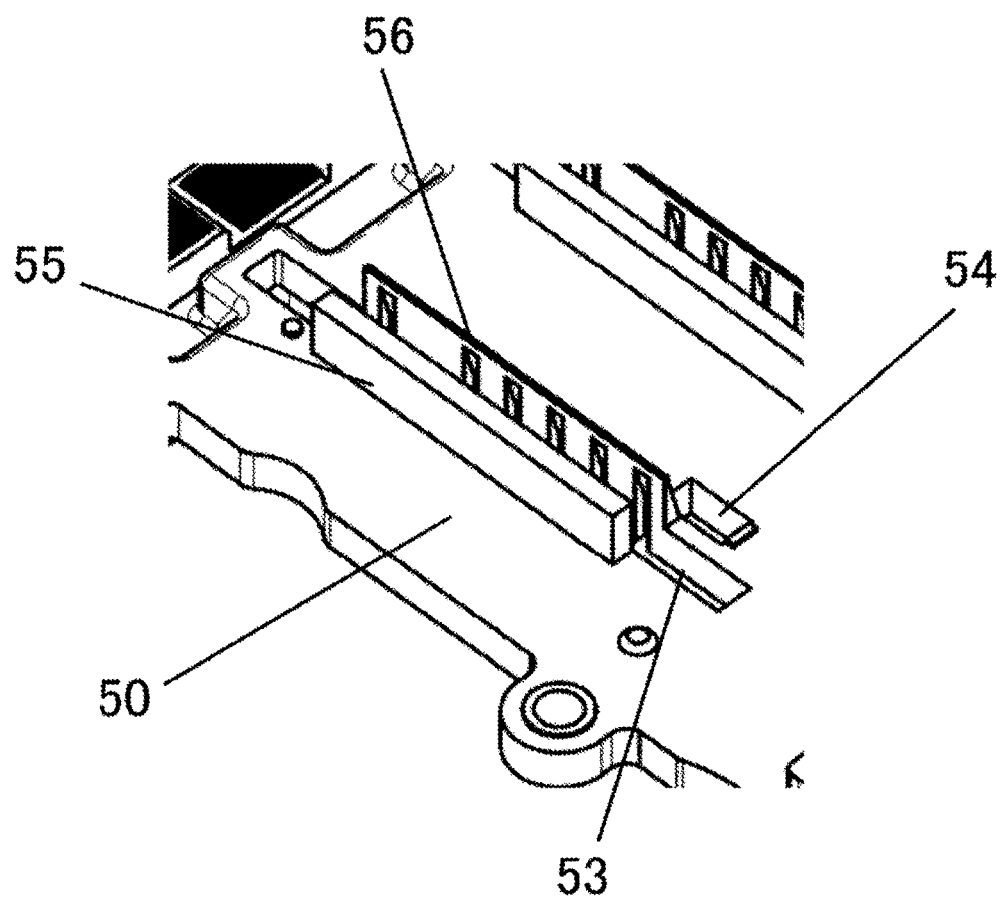
FIG. 8 is an enlarged view of a region VIII of FIG. 7.

FIG. 7 is a perspective view of the molded bus bar illustrated in FIG. 2 as viewed from the back side, and FIG. 8 is an enlarged view of a region VIII of FIG. 7. The first extended portion 55 has a rectangular cross-sectional shape and extends in a space between one edge 41a (see FIGS. 5 and 6) in a width direction of the opening 41 of the metallic member 40 and one surfaces of the input/output terminal 101 and the like to which the connection terminal 51a is connected. The second extended portion 56 has a triangular cross-sectional shape having a tapered tip and extends in a space between another edge 41b (see FIGS. 5 and 6) in the width direction of the opening 41 of the metallic member 40 and the other surfaces, that is, surfaces opposite to the one surfaces to which the connection terminal 51a is connected of the input/output terminal 101 and the like. The first and second extended portions 55 and 56 are formed along an arrangement direction of the input/output terminal 101 and the like so as to extend over the entire length of the input/output terminal 101 and the like.

That is, the first extended portion 55 is arranged in the space between all the one surfaces of the DC positive/negative input terminals 101 and 103 and the AC output terminal 102 and the one edge 41a of the opening 41 of the metallic member 40. The second extended portion 56 is arranged in the space between all the other surfaces of the DC positive/negative input terminals 101 and 103 and the AC output terminal 102 and the other edge 41b of the opening 41 of the metallic member 40. Further, the first and second extended portions 55 and 56 have a vertical length penetrating through the opening portion 41 of the metallic member 40 in a thickness direction. Therefore, a space distance and a creepage distance between the one edge 41a of the opening 41 of the metallic member 40 and the one surfaces of the input/output terminal 101 and the like to which the connection terminal 51a is connected are larger than the first and second extended portions 55 and 56. Thus, it is possible to secure insulating properties between the metallic member 40 and the input/output terminal 101 and the like of the semiconductor module 30.

Figure 9:
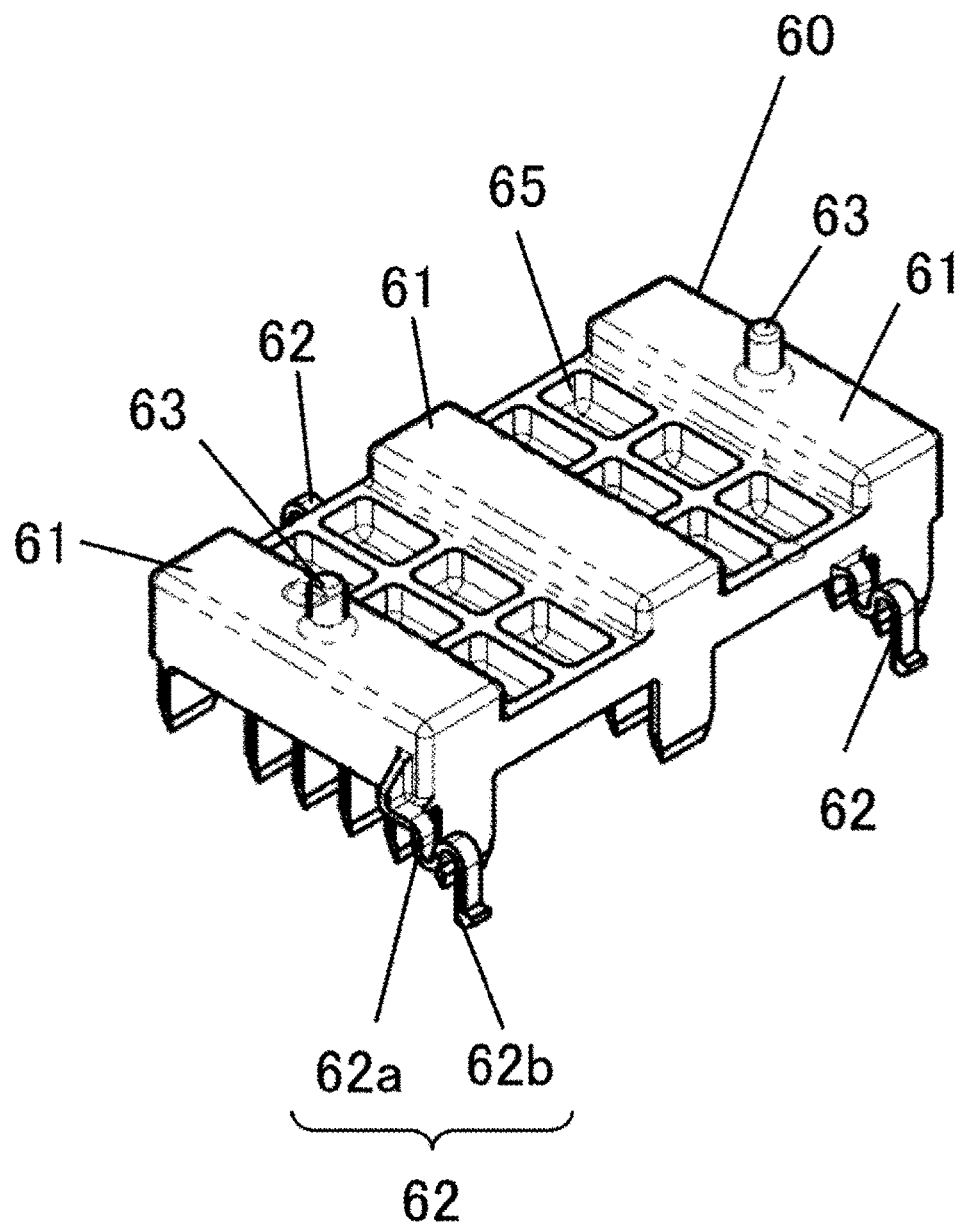
FIG. 9 is an enlarged view of an insulating member illustrated in FIG. 2.
Figure 10:
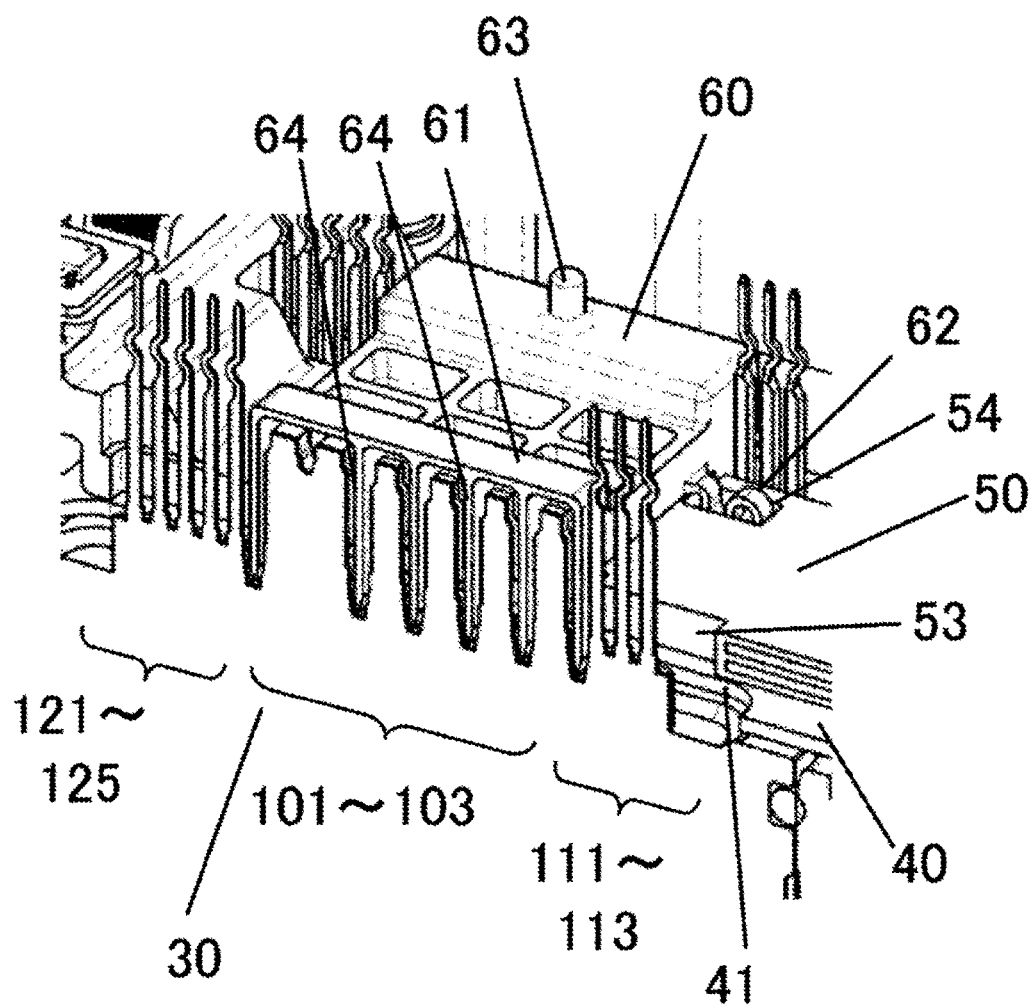
FIG. 10 is a perspective view taken along a line X-X of FIG. 1.
Figure 11:
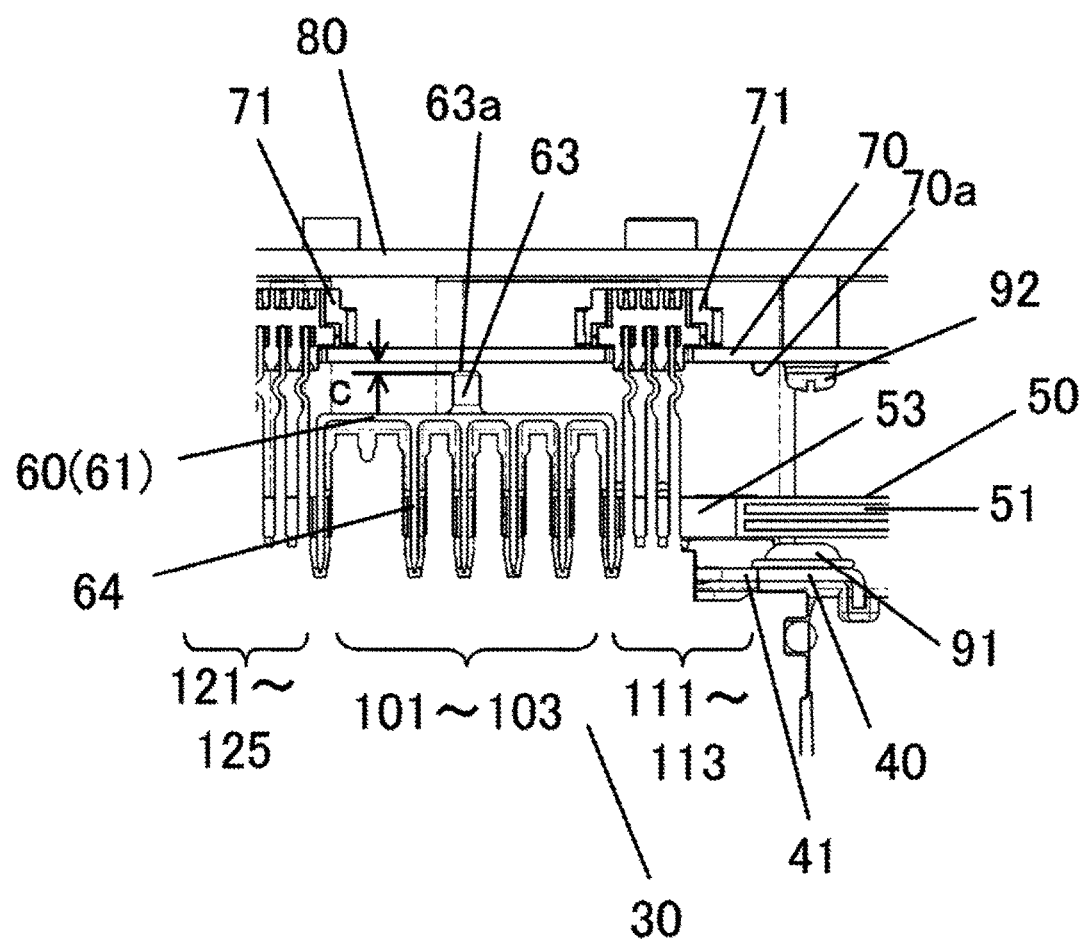
FIG. 11 is a cross-sectional view illustrating a state where a control circuit board is assembled to the state illustrated in FIG. 10.

FIG. 9 is an enlarged view of the insulating member illustrated in FIG. 2. FIG. 10 is a perspective view taken along a line X-X of FIG. 1, and FIG. 11 is a cross-sectional view illustrating a state where the control circuit board is assembled to the state illustrated in FIG. 10. The insulating member 60 is a resin-molded member having three terminal insertion portions 61, three fixing elastic portions 62, and two protruding portions 63. A plurality of concave portions 65 formed between the terminal insertion portions 61 is configured to prevent shrinkage at the time of molding. A plurality of partition pieces 64 is arranged in each of the terminal insertion portions 61 The insulating member 60 is attached to the molded bus bar 50 after the connection terminal 51a of the molded bus bar 50 is bonded to the input/output terminal 101 and the like of the semiconductor module 30. The insulating member 60 is attached to the molded bus bar 50 by engaging each of the fixing elastic portions 62 with a fixing opening 54 of the molded bus bar 50. The fixing elastic portion 62 has a deformation portion 62a and a locking portion 62b which extend in a corrugated shape. A lower surface of the locking portion 62b is an inclined surface that rises toward a distal end side. When each of the locking portions 62b of the insulating member 60 is positioned in accordance with the fixing opening 54 of the molded bus bar 50 and pushed down toward the molded bus bar 50, the lower surface of the locking portion 62b is pressed against an edge of the fixing opening 54 so that the deformation portion 62a is compressed. When each of the locking portions 62b of the insulating member 60 passes through the fixing opening 54 in this state, the deformation portion 62a expands below the molded bus bar 50 by its restoring force. As a result, each of the locking portions 62b of the insulating member 60 is engaged with a peripheral edge portion of the fixing opening 54 of the molded bus bar 50. In this manner, the insulating member 60 can be fixed to the molded bus bar 50 by simple work of merely pressing the insulating member 60 toward the molded bus bar 50 so that the work efficiency is favorable.

In this state, each of the partition pieces 64 provided in the terminal insertion portion 61 is set so as to be arranged between the input/output terminal 101 and the like of the semiconductor module 30 as illustrated in FIGS. 10 and 11. Each of the partition pieces 64 penetrates the opening portion 53 of the molded bus bar 50 and extends to the vicinity of an upper surface 36a (see FIG. 3A) of a support member 36 that supports the input/output terminal 101 and the like of the semiconductor module 30. Thus, it is possible to secure mutual insulating properties of the input/output terminal 101 and the like of the semiconductor module 30.

As illustrated in FIG. 11, the signal terminal 111 and the like arranged on both the sides of the input/output terminal 101 and the like of the semiconductor module 30 penetrate through the opening portion 53 of the molded bus bar 50 and are connected to the connector 71 of the control circuit board 70. The control circuit board 70 is attached to the holding member 80 by a fastening member 92 such as a screw. The protruding portions 63 are provided on the upper surfaces of the terminal insertion portions 61 on both the end sides of the insulating member 60, respectively. A gap c between an upper surface 63a of the protruding portion 63 and a lower surface 70a of the control circuit board 70 is set to a dimension capable of regulation of detachment of the insulating member 60 from the input/output terminal 101 and the like of the semiconductor module 30.

As described above, the insulating member 60 is fixed to the molded bus bar 50 in the state where the locking portion 62b is engaged with the peripheral edge portion of the fixing opening 54 of the molded bus bar 50. Thus, there is a possibility that the engagement of the locking portion 62b is released due to vibration or impact and the insulating member 60 is detached from the molded bus bar 50. However, even if the engagement of the locking portion 62b of the insulating member 60 is released, the protruding portion 63 abuts against the lower surface of the control circuit board 70, whereby the separation of the insulating member 60 is regulated.

According to the above-described one embodiment, the following operational effects are obtained. (1) In the power conversion device 10 in which the bus bar 51 of the molded bus bar 50 is connected to the input/output terminal 101 and the like of the semiconductor module 30 protruding through the opening 41 of the metallic member 40, the molded bus bar 50 includes the insulating extended portions 55 and 56 which extend in the space between the bus bar 51 and the opening 41 of the metallic member 40. Thus, it is possible to secure the insulating properties between the metallic member 40 and the input/output terminal 101 and the like of the semiconductor module 30, and it is possible to prevent the short circuit between the input/output terminal 101 and the like and the metallic member 40 even if a high voltage is applied to the input/output terminal 101 and the like.

(2) The extended portions 55 and 56 include the first extended portion 55 extending in the space between the one surfaces of the input/output terminal 101 and the like of the semiconductor module 30 and the one edge 41a of the opening 41 of the metallic member 40, and the second extended portion 56 extending in the space between the other surfaces opposing the one surfaces of the input/output terminal 101 and the like and the other edge 41b of the opening 41 of the metallic member 40. Thus, even when relative positional misalignment occurs between the semiconductor module 30 and the metallic member 40 at the time of assembling, it is possible to reliably prevent the short circuit between the input/output terminal 101 and the like and the metallic member 40.

(3) The metallic member 40 and the semiconductor module 30 are thermally coupled. Thus, the heat generated from the semiconductor module 30 can be dissipated via the metallic member 40.

(4) The cooling flow path forming body having the cooling flow path to cool the semiconductor module 30 is provided, and the metallic member 40 forms one surface of the cooling flow path forming body. Thus, it is possible to enhance cooling efficiency and to achieve reduction in size of the power conversion device.

(5) The semiconductor module includes the insulating member 60 that has the plurality of input/output terminals 101 and the like and the partition piece 64 arranged between the input/output terminals 101 and the like and is fixed to the molded bus bar 50. Thus, it is possible to secure the insulating properties between the input/output terminals 101 and the like of the semiconductor module 30, and it is possible to prevent the short circuit between the input/output terminals 101 and the like even if a high voltage is applied to the input/output terminal 101 and the like.

(6) Further, the control circuit board 70 arranged to be separated from the insulating member 60 is provided, and the control circuit board 70 and the insulating member 60 are arranged at an interval which enables regulation of separation of the insulating member 60 from the input/output terminal 101 and the like. Thus, even when the fixing of the insulating member 60 and the molded bus bar 50 is released, the insulating member 60 does not separate from the input/output terminal 101 and the like, and the reliability can be improved.

Incidentally, the bus bar 51 has been exemplified as the molded bus bar 50 insert-molded in the resin portion 52 in the above-described embodiment. However, the bus bar 51 may be integrally fixed to the resin portion 52 by a fastening member such as a screw and a pin, or caulking or the like that fixes the resin portion 52 by melting.

In the above-described embodiment, the extended portions 55 and 56 of the molded bus bar 50 have been exemplified as the structures formed to oppose the input/output terminals 101 to 103 of the semiconductor module 30. However, the extended portions 55 and 56 of the molded bus bar 50 may be formed so as to oppose only the terminal having the possibility of short circuit with respect to the metallic member 40 among the input/output terminals 101 to 103.

In the above-described embodiment, the structure in which the control circuit board 70 is arranged above the insulating member 60 and the control circuit board 70 regulates the separation of the insulating member 60 from the input/output terminal 101 and the like of the semiconductor module 30 has been exemplified. However, the layout of the control circuit board 70 is arbitrary, and a structure in which the control circuit board 70 is not arranged immediately above the insulating member 60 may be adopted and the separation of the insulating member 60 from the input/output terminal 101 and the like of the semiconductor module 30 may be regulated using another member or part.

In the above-described embodiment, the structure in which the protruding portion 63 is provided on the insulating member 60 and the protruding portion 63 abuts against the control circuit board 70 to regulate the separation from the input/output terminal 101 and the like has been exemplified. However, the upper surface of the insulating member 60 may abut against the control circuit board 70 so as to regulate the separation of the insulating member 60 from the input/output terminal 101 and the like without providing the protruding portion 63 of the insulating member 60. Alternatively, another regulating member other than the control circuit board 70 may be arranged above the insulating member 60, and the separation of the insulating member may be regulated using the regulating member. In the case of adopting the structure in which the regulating member is provided, it is also possible to provide a protruding portion on the regulating member.

In the above-described embodiment, the structure in which the signal terminal 111 and the like of the semiconductor module 30 are connected to the connector 71 provided in the control circuit board 70 has been exemplified. However, the signal terminal 111 and the like may be inserted into a through-hole provided in the control circuit board 70 and connected by soldering or the like.

In the above-described embodiment, the structure in which the extended portions 55 and 56 of the insulating member 60 are formed to oppose the input/output terminal 111 and the like of the semiconductor module 30 and not to oppose the signal terminal 111 and the like has been exemplified. However, the extended portions 55 and 56 of the insulating member 60 may be formed so as to oppose the signal terminal 111 and the like together with the input/output terminal 111 and the like.

In the above-described embodiment, the power conversion circuit including the six power semiconductor modules 30 having the function as a three-phase arm circuit has been exemplified. However, the present invention can be applied to the power conversion device 10 including one power semiconductor module 30 and three power semiconductor modules 30.

In the above-described embodiment, an inverter device using the IGBTs 110 and 120 has been exemplified as the power conversion device 10. However, the present invention can also be applied to an inverter circuit using a thyristor, a gate turn off thyristor (GTO), or the like, instead of the IGBTs 110 and 120.

Further, the present invention is not limited to the inverter device that performs DC-AC conversion, but can also be applied to other power conversion devices such as a matrix converter that performs AC-AC conversion.

Although various embodiment and modifications have been described as above, the present invention is not limited to these contents. Other aspects conceivable within a technical idea of the present invention are also included within the scope of the present invention.

REFERENCE SIGNS LIST

10 power conversion device
11 housing main body (cooling flow path forming body)
20 intermediate assembly
30 power semiconductor module
40 metallic member
41 opening
41a one edge
41b other edge
50 molded bus bar (connecting member)
51 bus bar (connection conductor)
52 resin portion
55 first extended portion
56 second extended portion
60 insulating member
64 partition piece (partition portion)
70 control circuit board (regulating member, circuit board)
101, 103 input terminal
102 AC output terminal

The invention claimed is:

1. A power conversion device comprising:
    a semiconductor module having an input or output terminal;
    a connecting member in which a resin portion is integrally provided with a connection conductor connected to the terminal; and
    a metallic member having an opening through which the terminal protrudes and supporting the semiconductor module,
    wherein the connecting member includes an insulating extended portion extending in a space between the terminal and the opening of the metallic member.

2. The power conversion device according to claim 1, wherein
    the connection conductor of the connecting member is connected to one surface of the terminal, and
    the extended portion includes a first extended portion extending in a space between the one surface of the terminal and one edge of the opening of the metallic member and a second extended portion extending in a space between another surface of the terminal opposing the one surface and another edge of the opening of the metallic member.

3. The power conversion device according to claim 1, wherein
    the metallic member and the semiconductor module are thermally coupled.

4. The power conversion device according to claim 1, further comprising
    a cooling flow path forming body having a cooling flow path to cool the semiconductor module,
    wherein the metallic member forms one surface of the cooling flow path forming member.

5. The power conversion device according to claim 1, wherein
    the semiconductor module includes a plurality of the terminals,
    the power conversion device further comprising an insulating member that includes a partition portion arranged between the terminals and is fixed to the connecting member.

6. The power conversion device according to claim 5, further comprising
    a regulating member that regulates separation of the insulating member from the terminal.

7. The power conversion device according to claim 6, wherein
    the semiconductor module further includes a signal terminal, and
    the regulating member is a circuit board having a connection portion to which the signal terminal is connected.

* * * * *